United States Patent [19]

Haque et al.

[11] 4,350,975
[45] Sep. 21, 1982

[54] DUAL BANDWIDTH AUTOZERO LOOP FOR A VOICE FREQUENCY CODEC

[75] Inventors: Yusuf A. Haque, Santa Clara; Richard W. Blasco, Campbell, both of Calif.

[73] Assignee: American Microsystems, Inc., Santa Clara, Calif.

[21] Appl. No.: 170,041

[22] Filed: Jul. 18, 1980

[51] Int. Cl.³ .............................................. H03K 13/08
[52] U.S. Cl. ...................... 340/347 CC; 340/347 AD; 340/347 M
[58] Field of Search .... 340/347 M, 347 CC, 347 AD, 340/347 DA; 375/28; 330/9

[56] References Cited

U.S. PATENT DOCUMENTS 4,143,361 3/1979 Tammes et al. ............... 340/347 CC
4,195,282 3/1980 Cameron ........................ 30/347 AD
4,200,863 4/1980 Hodges et al. ............ 340/347 DA X Primary Examiner—Thomas J. Sloyan
Attorney, Agent, or Firm—Alan H. MacPherson; Steven F. Caserza; Richard Franklin

[57] ABSTRACT

An autozero loop for eliminating offsets in the analog to digital converter section of a voice frequency coder-decoder (CODEC) utilizing an array of capacitors and a linear resistor string. The autozero loop functions with a relatively small time constant to null offsets quickly during the power-up phase of CODEC operation and with a higher time constant after the power-up phase. A dual bandwidth sub-circuit in the loop is connected to a voltage generator and controlled by signals from a logic circuit to operate at different bandwidths and thus provide different offset cancelling feedback signals during the power-up and normal operating phases.

4 Claims, 1 Drawing Figure

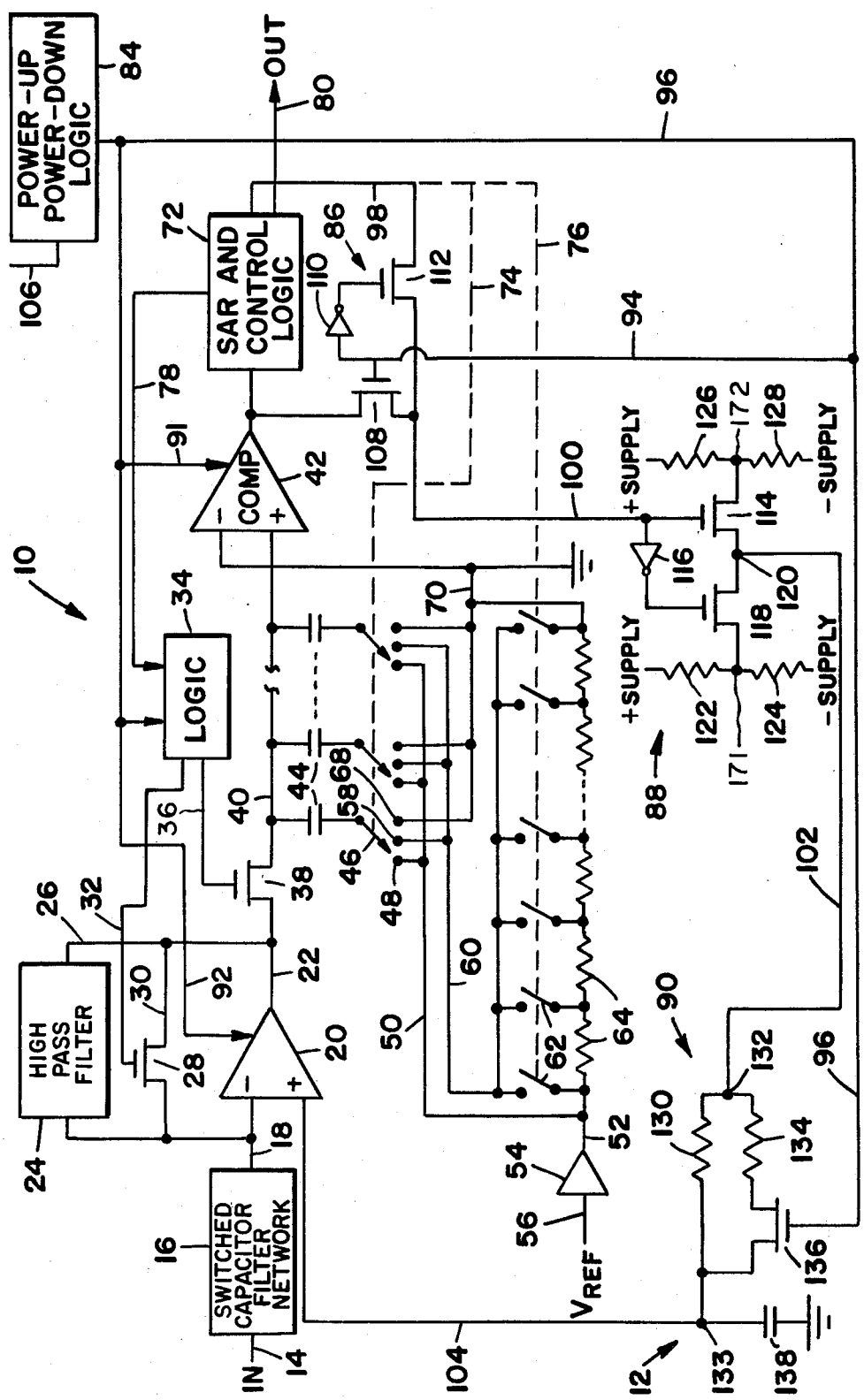

DUAL BANDWIDTH AUTOZERO LOOP FOR A VOICE FREQUENCY CODEC

BACKGROUND OF THE INVENTION

This invention relates to an autozero loop for a voice frequency coder-decoder (CODEC).

In transmission systems, CODECs (coder-decoders) with appropriate filters are used for transmission and reception of voice signals. In order to meet the required gain tracking, idle channel noise and signal to distortion specifications, any DC offset in the transmit filter-coder combination of the CODEC must be nulled. Heretofore, an autozero loop has been utilized to achieve this function. This loop takes the long term average of the sign bit of the processed word, and feeds the resulting voltage back into the system using negative feedback to null any DC offset. In CODECs previously disclosed, only a single bandwidth autozero loop has been used to cancel offset of the coder. For example, see "A Two-Chip PCM Codec for Per Channel Applications", James B. Cecil, Edwin M. W. Chow, John A. Flink and James E. Solomon, IEEE International Solid State Circuits Conference, Feb. 1978, pp. 176-177. Also, heretofore the offset associated with the filter in the CODEC is concelled using capacitive coupling between the filter and the encoder. A serious disadvantage with this arrangement is that it requires an off chip capacitor, along with greater pinout connectors, thus resulting in a relatively large and more complicated device.

Another problem arises because an autozero loop by definition has a long time constant associated with it and, therefore, is not functional immediately after the CODEC is enabled (i.e., powered up). This delay impairs system performance for a few seconds immediately after power-up. Also, this delay creates problems in automatic testing of the devices where the total available test time is of the order of several seconds.

It is therefore one object of the present invention to provide an improved autozero loop for a voice frequency CODEC that solves the aforesaid problems.

Other more specific objects of the invention are to provide an autozero loop that: (1) will cancel offsets in the filterencoder combination with the filter direct coupled to the encoder input; (2) will achieve rapid acquisition of offsets in the system immediately after power up; and (3) will use a package with fewer pins compared to systems wherein the coder and filter are capacitor coupled (capacitor coupling requires that the output of the filter and the input of the coder be available off chip through pins on the package).

A further object of the invention is to provide an autozero loop circuit for a voice frequency CODEC that is particularly well adapted for implementation as an integrated circuit device.

BRIEF SUMMARY OF THE INVENTION

In accordance with the principles of this invention, an autozero loop is provided in combination with an A/D converter in the CODEC transmit section utilizing charge redistribution in a binary weighted array of capacitors and a linear resistor string. In the transmit section the voice signal is supplied to a switched capacitor active low-pass filter through an uncommitted operational amplifier that is required as part of an antialiasing filter along with other external passive components The low-pass filter is followed by a high-pass filter which also acts as a sample-and-hold for the encoder that performs the analog to digital conversion. The output from the encoder is furnished through a clocked signal switch and a capacitor connector lead to a comparator, the capacitor array with its linear resistor string being connected to the capacitor connector lead in parallel. The autozero loop is included as a necessary part of the CODEC for the purpose of cancelling any offset in the encoder/filter combination.

Offsets are cancelled by averaging the SIGN bit of the processed word and feeding back the resultant information using negative feedback. The time constant required to achieve this is of the order of several hundreds of milliseconds. Heretofore, this time constant caused impairment of system performance immediately after power up and also made automatic testing of the devices difficult and time consuming.

In the present invention, the autozero loop is constructed so that it will work with a small time constant (to null offsets quickly) during the time the device takes to achieve the power-up state, but as soon as power up is achieved, the device switches to a high time constant autozero loop and starts off with all offsets cancelled.

The elements of the autozero loop comprise a logic control including a successive approximation rgister (SAR) circuit enabled from an external source and connected to the comparator output, a power-up/power-down logic circuit, a switch control sub-circuit, an attenuated positive and negative voltage generator and a dual bandwidth sub-curcuit. The power-up/power-down logic circuit provides control signals to the filter operational amplifier, the comparator, the switch control sub-circuit and to a resistor switch in one leg of the bandwidth sub-circuit. The switch control also receives an input from the SAR logic circuit and provides an output to the attenuated voltage generator whose output is also furnished to the dual bandwidth sub-circuit. When the CODEC is turned on, the power-up/power-down logic circuit provides an output to the switch control sub-circuit that in turn allows the comparator output to be supplied to the positive and negative voltage generator. The voltage generator supplies an output to parallel legs of the resistor bridge in the dual bandwidth circuit. The resistor bridge in combination with a capacitor (RC network) provides a low impedance path variable input to the operational amplifier for the A/D circuit During the power-up phase the power-up/power-down logic circuit provides an output signal to the resistor switch to cause the dual bandwidth circuit to operate in the relatively large bandwith mode, thereby nulling the offset. After the power-up phase has been completed, the resistor switch is turned off by the logic circuit and the dual bandwidth sub-circuit furnishes a normal output signal to the input operational amplifier for normal power level operation.

Other objects, advantages and features of the invention will become apparent from the following detailed description in conjunction with the accompanying drawing.

BRIEF DESCRIPTION OF THE DRAWING

The single FIGURE is a circuit diagram showing an analog to digital section of CODEC utilizing an autozero loop according to the present invention.

DESCRIPTION OF THE PREFERRED EMBODIMENT

Referring to the drawing, a CODEC analog to digital (A/D) converter circuit 10 is shown which utilizes an autozero loop 12 embodying the principles of the present invention. In this circuit an analog signal is sampled at a predetermined rate and converted to a digital output while the autozero loop functions to eliminate or null offsets in the filter/coder section. As shown, the input analog signal from a data source is provided on lead 14 to a switched capacitor filter network 16 whose output is furnished in a lead 18 to the negative input of an operational amplifier 20 providing an output in a lead 22. A feedback network for this amplifier connected to leads 18 and 22 includes additional switched capacitor elements forming part of a high-pass filter section 24 in a lead 26. A bypass switch 28 is provided in a feedback lead 30 in parallel with the filter section 24, which, when closed, causes operational amplifier 20 to function as a unity gain buffer. This latter switch is preferably a metal-oxide-silicon field effect transistor (MOSFET) whose gate is controlled via a lead 32 by a logic circuit 34. Another output 36 from the logic circuit 34 provides a periodic signal to the gate of a signal switch 38 which has one source/drain terminal connected to the amplifier output lead 22. The other terminal of this signal switch is connected via a lead 40 to the positive input of a signal comparator 42 whose negative input is connected to ground. Connected to the lead 40 are the upper plates of a parallel array of capacitors 44. These capacitors are sized (as by their area on the chip) in a predetermined manner so that each one is twice or one-half the size of its adjacent capacitor. The bottom plate of each of these capacitors is connected to its own three pole switch 46. The first terminal 48 on each of these switches is connected to a common lead 50 to the output lead 52 from a buffer amplifier 54. The input 56 to this latter amplifier is supplied from a constant reference voltage source ($V_{REF}$). The second terminal 58 on each of the switches 46 is connected to a common lead 60 to which is connected one terminal of each of a series of switches 62 which connect to different points on resistor string 64. The other terminal for each of these latter switches is connected to the reference voltage lead 52 or to the end of one resistor 64 of a linear series of such resistors of equal size connected in series in the lead 52.

The third terminal 68 for each of the capacitor switches 46 is connected to a common lead 70 that is also connected to ground.

The capacitor switches 46 and the resistor switches 62 are all controlled by a successive approximation register (SAR) and control logic circuit 72 via a pair of leads 74 and 76 respectively, indicated by broken lines. Another output from the sub-circuit 72 is provided via a lead 78 to the logic circuit 34 for the signal switch 38. The SAR circuit 72 also provides, in a well-known manner, the digital output of the circuit 10 on lead 80.

The autozero loop 12 according to the invention comprises a power-up/power-down logic circuit 84, a switch control sub-circuit 86, an attenuated positive and negative voltage generator 88, and a dual bandwidth sub-circuit 90. The power-up/power-down logic circuit 84 is connected by leads 91 and 92 to the comparator 42 and the amplifier 20 respectively and via a lead 94 to the switch control sub-circuit 86 as well as to the dual bandwidth circuit 90 via a lead 96. The switch control circuit 86 receives an input via a lead 98 from the SAR and control logic 72 and provides an output signal via lead 100 to the attenuated positive and negative voltage generator 88 whose output via a lead 102 is furnished to the dual bandwidth circuit 90. The output signal from this dual bandwidth circuit 90 is provided on lead 104 to the plus input terminal of the amplifier 20.

When the power-up/power-down logic 84 receives an "on" signal via input lead 106 from some external source source such as a clock signal used to control the operation of input switch 38 and thus the A/D sampling rate, an output signal is provided through leads 94 and 96 to the switch control sub-circuit 86 and more particularly to turn on a MOSFET switch 108 in the lead 100 from the comparator 42 to the voltage generator 88. The signal on lead 94 is also provided through an inverter 110 to a switch 112 in the lead 98 from the SAR and control logic circuit 72 to cause this switch to open. Thus, at this point, the comparator output is supplied via the lead 100 to the gate of a first MOSFET switch 114 and through an inverter 116 to the gate of a second MOSFET switch 118 of the voltage generator circuit 88. One source/drain terminal of each of these latter MOSFET's are connected together at a node 120 from which extends the lead 102 to the dual bandwidth circuit 90. The other source/drain terminal of MOSFET 118 is connected through a resistor 122 having a value $R_3$ to a positive voltage supply and through a resistor 124 with a value $R_4$ to a negative voltage supply. Similarly, the other terminal of MOSFET 114 is connected through a resistor 126 with a value $R_4$ to a positive voltage supply and through a resistor 128 with a value $R_3$ to a negative voltage supply. The resistors 122, 124, 126 and 128 may be in the form of MOS devices, if desired. the sub-circuit 88 thus supplies an attenuated positive voltage at node 171 and an attenuated negative voltage node 172, which can be made available at node 120 by turning on either switch 118 or 114. From node 120, the positive or negative voltage is supplied through lead 102 to the dual bandwidth circuit 90.

The dual bandwidth circuit comprises a resistor 130 with a value $R_1$ connected between a node 132 on lead 102 and a node 133 on the lead 104. In parallel with resistor 130 is a resistor 134 with a value $R_2$ in series with a MOSFET switch 136 which also has a resistance value $R_{53}$ and whose gate is connected by leads 96 and 94 and inverter 110 to the switch control circuit 86. Also connected to the node 133 is the upper plate of a capacitor 138 whose lower plate is connected to ground. Capacitor 138 has a capacitance value C.

The circuit 10 has three phases of operation, namely: (1) when the circuit is in the power-down mode; (2) when the circuit is operating in the power-up mode (i.e., the normal operating mode); and (3) the period just after the power-up sequence has been initiated but not achieved.

Phase I when the circuit is in the power-down mode, external power supply voltages are supplied to the chip, but not distributed to much of the CODEC circuitry, due to action of on-chip power-down circuitry. Hence, the autozero loop is not functional.

Phase II During normal operation, all elements of the circuit are powered up. Switches 108, 136, and 28 are disabled or off, and switch 112 is on. The offset of the filter output from amplifier 20 and comparator 42 is reflected in the output SIGN bit of the signal sample being processed by the comparator. The output SIGN bit is fed from SAR and control logic 72 to switch 112 via lead 98. Switch 112 being on, the SIGN bit is fed via lead 100 to switch 114 and through inverter 116, to switch 118. If the SIGN bit is a logical one, corresponding to a positive sign, switch 114 is turned on, and switch 118 is turned off. Similarly, if the SIGN bit is a logical zero, corresponding to a negative sign, switch 114 is turned off, and switch 118 is turned on. The output SIGN bit (as attenuated by voltage generator 88) is integrated with time constant $$\left( \frac{R_3 R_4}{R_3 + R_4} + R_5 + R_1 \right) C$$

where $R_5$ is the resistance of switch 118 or switch 114. All of the resistors 122, 124, 126, 128, 130 and 134, are implemented with active devices on chip. Before the SIGN bit is integrated, its height is attenuated to $+X_1$ volts, as available at node 171, and $-X_2$ volts, as available at node 172, to limit the maximum voltage excursion seen at the input of the filter amplifier 20. This makes it possible to use a smaller time constant than would otherwise be possible. The time constant is of the order of several hundreds of milliseconds. The values of $X_1$, $X_2$ determine the magnitude of the offset voltage that the autozero loop is capable of cancelling.

Phase III When the power-up sequence is initiated, the power-up logic 84 detects this and powers up required components in the autozero loop. Filters 16 and 24 remain open circuits during Phase III, and output from SAR and control logic 72 is suppressed. Switches 28, 38, 108 and 136 are turned on and the SIGN of the processed word (which consists of the offset of the filter operational amplifier and comparator) is integrated by capacitor 138 and its associated resistors 130, 134, 122, 124, 126 and 128. The time constant for this integration is:

$$\left( \frac{R_1(R_2 + R_{53})}{R_1 + R_2 + R_{53}} + R_5 + \frac{R_3 R_4}{R_3 + R_4} \right) C$$

This time constant is small (a few milliseconds) and is achieved by making the combination of $(R_2+R_{53})$ small. As soon as power up is achieved (for example, when a phase locked loop contained in power up/power down logic 84 locks on to the external clock signal used to control the A/D sample rate), the operating mode switches to that described in Phase II. $R_{53}$ is the resistance of switch 136 when that switch is turned on.

The result of this integration is applied to the noninverting input of operational amplifier 20, which is now operating as a unity gain buffer, because switch 28 is closed. Essentially, then, in Phase III, the autozero quickly acquires (nulls) the offset by virtue of its large bandwidth and waits for the circuit to power up. When power up is achieved (and indicated by logic circuit 84), the device switches to Phase II (normal operation) shutting off switch 136 and thus using the small bandwidth autozero loop with its large time constant. This does not cause any problem now since the offset has already been cancelled in the Phase III power-up mode and hence overall system performance is acceptable immediately after power up without having to wait for several seconds.

To those skilled in the art to which this invention relates, many changes in construction and widely different embodiments and applications of the invention will suggest themselves without departing from the spirit and scope of the invention. The disclosures and the description herein are purely illustrative and are not intended to be in any sense limiting.

We claim:

1. An analog to digital converter circuit means for providing a digital representation of an analog input signal, said digital representation including an output sign bit indicating the polarity of said analog input signal, said converter means containing an operational amplifier having a first and a second input lead, and an autozero loop, said first input lead being connected to receive an analog input signal to be converted, said analog to digital converter capable of operating in either a power-up mode or a normal analog to digital conversion mode, said analog to digital converter comprising:

a power-up/power-down logic circuit for providing output signals characteristic of the present operating mode of said analog to digital converter;

a dual-bandwidth sub-circuit means controlled by said power-up/power-down logic circuit for providing a feedback signal to said second operational amplifier input lead to null any D.C. offsets created by said analog to digital converter circuit, wherein said dual-bandwidth subcircuit operates with a relatively small time constant sufficient to cancel circuit offsets during a short power-up interval, and a relatively large time constant to continuously cancel variable circuit offsets during said normal analog to digital conversion mode of said analog to digital converter circuit without requiring interruption of the normal operation of the analog to digital converter circuit, wherein said feedback signal is obtained by said dual-bandwidth sub-circuit integrating over time a selected voltage corresponding to the value of said output sign bit.

2. Circuit as in claim 1 where said dual-bandwidth subcircuit comprises an RC network of variable impedance, said variable impedance controlled by said power-up/power-down logic circuit.

3. An autozero loop for use in analog to digital converters for providing a digital output signal corresponding to an analog input signal, said digital output signal including an output sign bit corresponding to the polarity of said analog input signal, wherein said analog to digital converters operate in either a power-up mode or a normal analog to digital conversion mode, said autozero loop comprising:

means for integrating over time a selected voltage corresponding to said output sign bit of said analog to digital converter;

means for varying the time constant over which said means for integrating operates, the value of said time constant being less when said analog to digital converter is in said power-up mode than when said analog to digital converter is in said normal analog to digital conversion mode, wherein said means for integrating operates to continuously cancel variable circuit offsets, thereby more quickly cancelling offsets during a short power-up interval than during normal analog to digital conversion; and means for feeding back the results of said integration as an offset cancelling signal for use in said analog to digital converter.

4. In an analog to digital converter circuit for a CODEC that includes an operational amplifer having one input lead for receiving an input analog signal, a signal switch connected to the output lead of the operational amplifier and to one end of a capacitor bus lead whose other end is connected to one input lead of a comparator, a control logic sub-circuit connected to the output lead of the comparator, a series of capacitors whose upper plates are all connected in parallel to said bus lead and whose lower plates are connected through variable switches to a reference voltage source, the improvement comprising providing a second input lead to said operational amplifier, and providing an autozero loop for providing the input signal on the second input lead to said operational amplifier for the purpose of cancelling offsets in the circuit during both the power-up and normal operating modes, said autozero loop comprising:

a power-up/power-down logic circuit for providing output signals characteristic of the present operating mode;

a voltage generator means connected to the output of said comparator;

switch means connected to said control logic means and said power-up/power-down logic circuit for controlling the output of said voltage generator means; and a dual bandwidth sub-circuit connected to the output of said voltage generator means and to said power-up/power-down logic circuit for providing an output signal to said second input lead of said operational amplifier for nulling D.C. offsets created in said analog to digital converter circuit, said dual bandwidth sub-circuit being responsive to the output signal from said power-up/power-down logic circuit to function with a relatively small time constant sufficient to cancel circuit offsets during a power-up interval, and a relatively large time constant sufficient to allow proper analog to digital conversion during normal operation of the CODEC.

* * * * *

UNITED STATES PATENT AND TRADEMARK OFFICE
CERTIFICATE OF CORRECTION

PATENT NO. : 4,350,975
DATED : September 21, 1982
INVENTOR(S) : Yusuf A. Haque, Richard W. Blasco It is certified that error appears in the above—identified patent and that said Letters Patent is hereby corrected as shown below:

In Column 1, line 26, delete "concelled" and insert --cancelled--;

In Column 1, line 67, after "components" insert --.--;

In Column 2, line 36, before "bandwidth" insert --dual--;

In Column 2, line 50, after "circuit" insert --.--;

In Column 2, line 66, between "of" and "CODEC" insert --a--;

In Column 4, line 10, between "source" and "such" delete "source";

In Column 4, line 35, between "desired." and "sub-circuit" delete "the" and insert --The--;

In Column 4, line 57, delete "when" and insert --When--.

Signed and Sealed this

Fifth Day of July 1983

[SEAL]

Attest:

GERALD J. MOSSINGHOFF

Attesting Officer       Commissioner of Patents and Trademarks